United States Patent
Chen

(10) Patent No.: US 6,893,963 B2
(45) Date of Patent: May 17, 2005

(54) METHOD FOR FORMING A TITANIUM NITRIDE LAYER

(75) Inventor: Ching-Hua Chen, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 16 days.

(21) Appl. No.: 10/408,070

(22) Filed: Apr. 4, 2003

(65) Prior Publication Data

US 2004/0198045 A1 Oct. 7, 2004

(51) Int. Cl.$^7$ .............................. H01L 21/44
(52) U.S. Cl. ............... 438/663; 438/256; 438/399; 257/300; 257/306
(58) Field of Search .............. 438/240–256, 438/396–399, 660–663, 648, 683; 257/300–306

(56) References Cited

U.S. PATENT DOCUMENTS 5,994,181 A * 11/1999 Hsieh et al. ............... 438/239
6,207,557 B1 * 3/2001 Lee et al. .................. 438/648

FOREIGN PATENT DOCUMENTS

TW          483141           4/2002

* cited by examiner

*Primary Examiner*—Caridad Everhart
*Assistant Examiner*—Calvin Lee
(74) *Attorney, Agent, or Firm*—Ladas & Parry LLP

(57) ABSTRACT

A method for forming a titanium nitride layer. The method includes the steps of exposing a semiconductor substrate to a reactive gas containing $TiCl_4$ and $NH_3$ for a first deposition to form a layer of titanium nitride on the substrate, at reaction pressure less than 1 torr and temperature less than 500° C.; placing the semiconductor substrate in $NH_3$ gas for a first annealing step, at pressure between 1 and 3 torr; exposing the semiconductor substrate to a reactive gas comprising $TiCl_4$ and $NH_3$ for a second deposition, at pressure exceeding 5 torr and temperature exceeding 500° C.; and subjecting the semiconductor substrate to a second annealing step in $NH_3$ gas, at pressure exceeding 5 torr.

21 Claims, 4 Drawing Sheets

METHOD FOR FORMING A TITANIUM NITRIDE LAYER

BACKGROUND OF THE INVENTION

1. Field of the Invention

The present invention relates to a method for fabricating semiconductor devices, and in particular to a method for forming a titanium nitride layer and the use of the method for fabricating capacitors of DRAMs.

2. Description of the Related Art

Dynamic Random Access Memory (DRAM) are widely applied integrated circuits. At the moment, the common DRAM cell in the product line is comprised of a transistor and a capacitor. As known to those familiar with this art, a capacitor is used to store electric charges, which provides electronic information. The capacitor must contain a sufficiently large capacitance, so that loss of information is avoided and refresh frequency is reduced.

Highly integrated DRAM elements are fulfilled by capacitors having three dimensional structures. In terms of material, capacitors are usually formed by metal-insulator-metal (MIM), or metal-insulator-semiconductor (MIS). Capacitance can be increased by increasing surface area of storage plate, increasing the dielectric constant of the dielectric layer, or reducing thickness of the dielectric layer. In the first method, capacitors having rugged surfaces, such as fin or tree shape are derived. For the third method thickness of the dielectric layer is currently very thin, and when smaller than 50 angstroms, direct tunneling is easily induced, causing excess leakage. This is not advantageous for element performance. As a result, there has been research into dielectric material having high dielectric constant to replace the commonly used silicon oxide. Tantalum pentoxide ($Ta_2O_5$) is a newer, valued option. It has replaced $SiO_2$ or $Si_3N_4$ to become a more ideal dielectric material. The reason is the high dielectric constant of Tantalum pentoxide, about three times that of $Si_3N_4$, i.e. 22~25. Hence, the stored charges increase greatly and performance of elements is improved.

A general structure for a stacked capacitor using $Ta_2O_5$ as the dielectric layer is shown in FIG. 1, wherein 2 represents the MOS transistor, 10 represents plug and lower electrode plate formed by conductive material, such as polysilicon or tungsten, 12 is the $Ta_2O_5$ capacitance dielectric layer, 14 is the upper electrode plate formed by TiN, and 16 is the inner dielectric layer. Although not drawn in the figure, the capacitance dielectric layer 12 separates the upper electrode plate and the lower electrode plate. The upper electrode plate of TiN on the $Ta_2O_5$ capacitance dielectric layer is usually formed by chemical vapor deposition and annealing. However, conventionally, the electrical properties, such as resistance (Rs) and leakage cannot meet the requirements simultaneously. That is, when high deposition temperature (600° C. and above) is used, $Ta_2O_5$ film is damaged, and the formation of $TiO_2$ upon the $Ta_2O_5$ causes increased leakage of TiN. if deposition temperature is lower (500° C. or less), the obtained TiN film exhibits high resistance. In other words, either high resistance or high leakage is induced by conventional processes.

SUMMARY OF THE INVENTION

In order to solve the above problems, an object of the invention is to provide a method for forming a titanium nitride layer by chemical vapor deposition, wherein the resistance and leakage of the TiN film are both low.

The method includes exposing a semiconductor substrate to a reactive gas containing $TiCl_4$ and $NH_3$ for a first deposition to form a layer of titanium nitride on the substrate, less than 1 torr and temperature is less than 500° C., placing the semiconductor substrate in $NH_3$ gas for a first annealing step, at pressure between 1 and 3 torr, exposing the semiconductor substrate to a reactive gas comprising $TiCl_4$ and $NH_3$ for a second deposition, at pressure exceeding 5 torr and temperature exceeding 500° C., and subjecting the semiconductor substrate to a second annealing step in $NH_3$ gas, at pressure exceeding 5 torr.

The method for forming a titanium nitride layer is also applicable in forming a capacitor for DRAMs, which includes the formation of a predetermined capacitor area on a substrate, followed by the formation of a lower electrode plate in the predetermined capacitor area. A dielectric layer is then formed on the lower electrode plate, followed by formation of a first titanium nitride layer on the dielectric layer by a first deposition step. The first titanium nitride layer is then subjected to annealing in a first annealing step, followed by the formation of a second titanium nitride layer on the first titanium nitride layer in a second deposition step. Lastly, the first and second titanium nitride layers are subjected to annealing in a second annealing step.

According to the method for forming a titanium nitride layer, when used to form TiN layer on a capacitance dielectric layer, such as $Ta_2O_5$, the titanium nitride layer formed exhibits low resistance and low leakage. It is an excellent material for upper electrode plate on the capacitance material $Ta_2O_5$.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 3A~3G show cross-sections of the method for forming a titanium nitride as the upper electrode plate for a $Ta_2O_5$ capacitance dielectric layer.

Figure 3A:
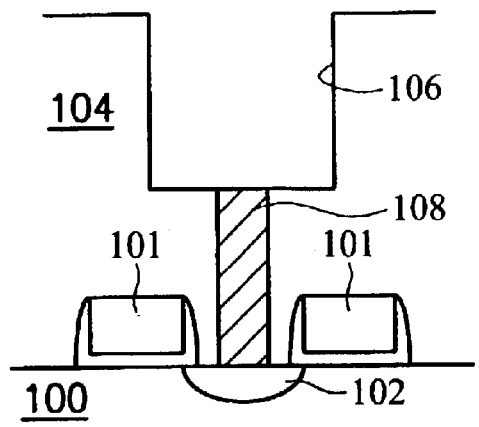
FIGS. 3A~3G illustrate cross-sections according to the embodiment of the invention.

First, a semiconductor substrate 100, as shown in FIG. 3A, is provided. Two neighboring MOS transistors 101 are formed on the substrate 100, and an interlayer dielectric layer 104, such as an oxide layer is formed to cover the transistors 101. Between the two transistors 101, a source/drain contact region 102 is formed in the substrate, wherein a plug 108 is formed in the interlayer dielectric layer 104 to contact the region. The plug 108 is formed by conductive material, such as polysilicon or tungsten. In addition, a capacitor predetermined area 106 is formed in the interlayer dielectric layer 104.

Figure 3B:
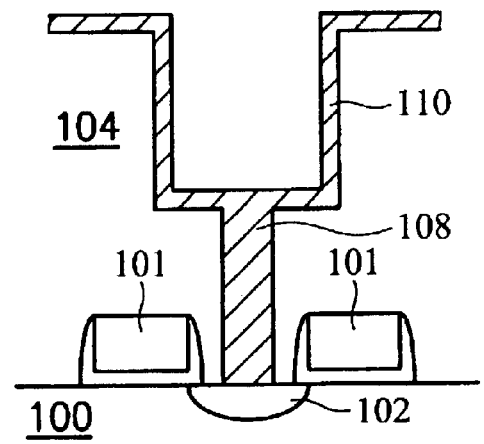
Figure 3C:
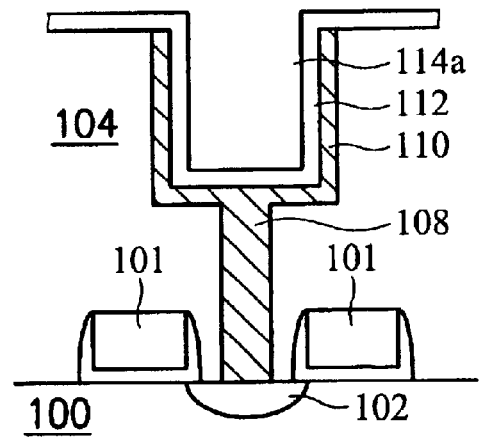

Next, as shown in FIG. 3B, a conductive layer 110 is formed conformally along the capacitor predetermined area 106, as the lower electrode plate. Conductive material can be identical to the plug 108, such as polysilicon or tungsten. Then, the conductive layer 110 around the capacitor predetermined area 106 is removed, and the conductive layer 110 on the sidewalls and bottom of the capacitor predetermined area 106 remains. Next, as shown in FIG. 3C, a capacitance dielectric layer 112 of $Ta_2O_5$ is formed along the capacitor predetermined area and the conductive layer 110. Formation of the capacitance dielectric layer is carried out in a low pressure chemical vapor deposition reactor. Reaction temperature is preferably 450° C., and precursors are preferably $Ta(OC_2H_5)_5$ and oxygen. Carrier gas is preferably Argon or other suitable carrier gases.

The following is an example showing the method for forming a titanium nitride layer on a $Ta_2O_5$ capacitance dielectric layer.

Suitable semiconductor substrates are not limited to semiconductor substrates having the above structures, any substrate formed with a $Ta_2O_5$ capacitance dielectric layer that requires the formation of titanium nitride is applicable.

Figure 1:
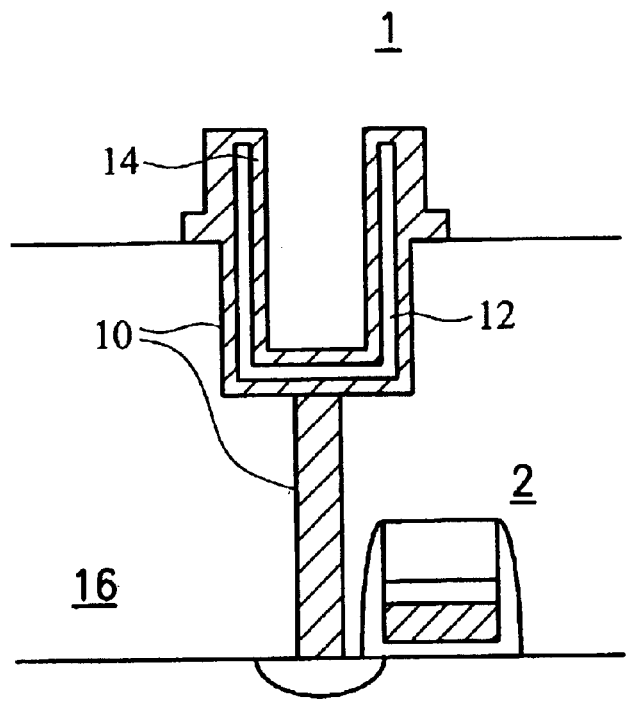
FIG. 1 illustrates a cross section of a conventional stacked capacitor.
Figure 2:
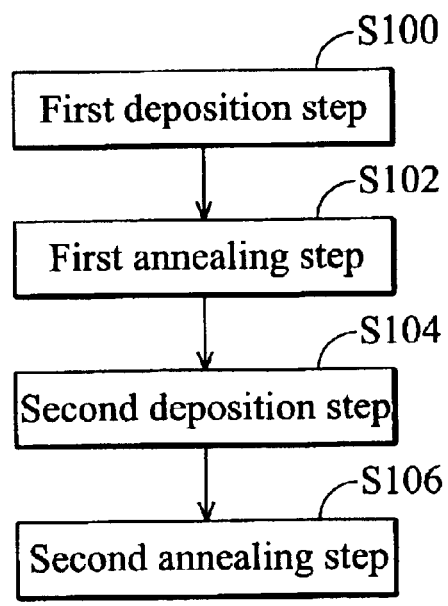
FIG. 2 is a flowchart showing the steps of the method for forming a titanium nitride layer of the invention.

Steps of the formation of a titanium nitride layer including a first deposition step S100, a first annealing step S102, a second deposition step S104 and a second annealing step S106 are illustrated in the flowchart as FIG. 2.

Figure 3D:
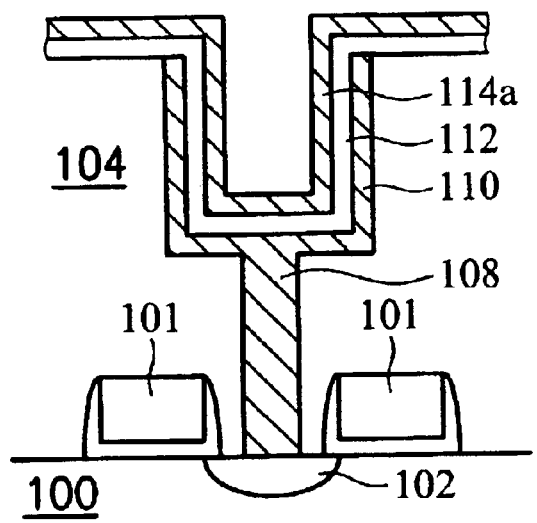

The semiconductor substrate 100 formed with a $Ta_2O_5$ capacitance dielectric layer is exposed to a reactive gas comprising $TiCl_4$ and $NH_3$ for a first deposition step S100 to form a titanium nitride layer 114a on the $Ta_2O_5$ capacitance dielectric layer 112, as shown in FIG. 3D. Preferable flow ratio of $NH_3/TiCl_4$ is 3~10. Reaction pressure is preferably less than 1 torr, and reaction temperature is preferably less than 500° C. Thickness of the titanium nitride layer 114a is preferably at least 30 angstroms, and the flowrate of $NH_3$ is preferably 40~60 sccm. During this first deposition step, flowrate of $TiCl_4$ is preferably kept low, to form titanium nitride slowly, preferably between 30~80 angstroms/min. Chlorine concentration is thus kept minimal, so that resistance of the titanium nitride formed is reduced. In addition, the usage of low flowrate for $TiCl_4$ also avoids the formation of $TiO_2$, thereby reducing the possibility of $TiO_2$ causing leakage.

Figure 3E:
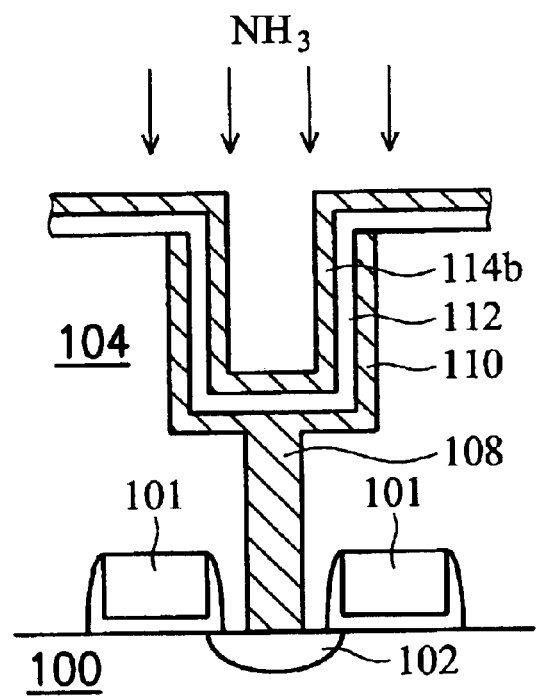

Next, the titanium nitride layer 114a is subjected to a first annealing step, as step S102 shown in FIG. 3E in a reactor filled with $NH_3$ gas, thus forming a titanium nitride layer 114b. Pressure is preferably between 1 and 3 torr, and the flowrate of $NH_3$ is preferably exceeding 1000 sccm. This first annealing step is carried out in an $NH_3$ environment. As a result, Cl ions in the titanium nitride layer are replaced by N atoms in $NH_3$, thus producing a more densified titanium nitride layer.

Figure 3F:
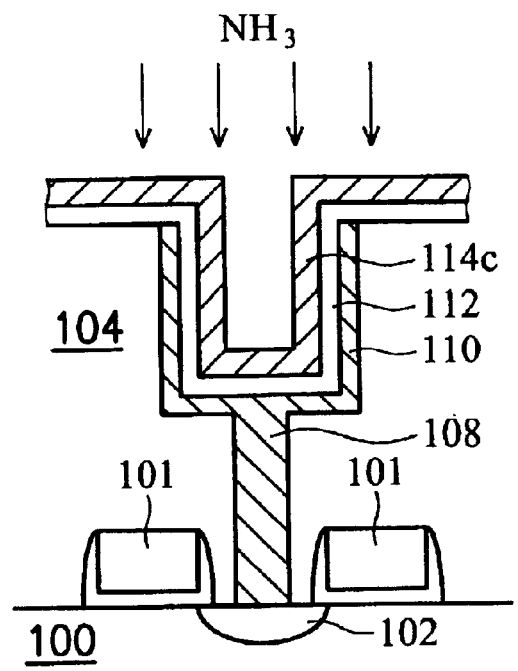

Then, the substrate 100 is subjected to a reactive gas comprising $TiCl_4$ and $NH_3$ for a second deposition step S104. Pressure is preferably exceeding 5 torr, with 10 torr as the maximum acceptable value. Flow ratio of $NH_3/TiCl_4$ preferably exceeds 5, with temperature of the substrate preferably between 500 and 600° C. When pressure exceeds 5 torr, the amount of gas increases, reducing heat, causing the heater below the substrate to detect the change, such that the substrate is heated to between 500 and 600° C. At this second deposition step, a higher flowrate of $TiCl_4$ is used for faster deposition. Preferable flowrate for $TiCl_4$ is at least 25 sccm, with deposition rate preferably from 100 to 500 angstroms/min. At these parameters, resistance of the titanium nitride layer is reduced. The titanium nitride layer 114c formed is as shown in FIG. 3F, at thickness of preferably at least 60 angstroms.

Figure 3G:
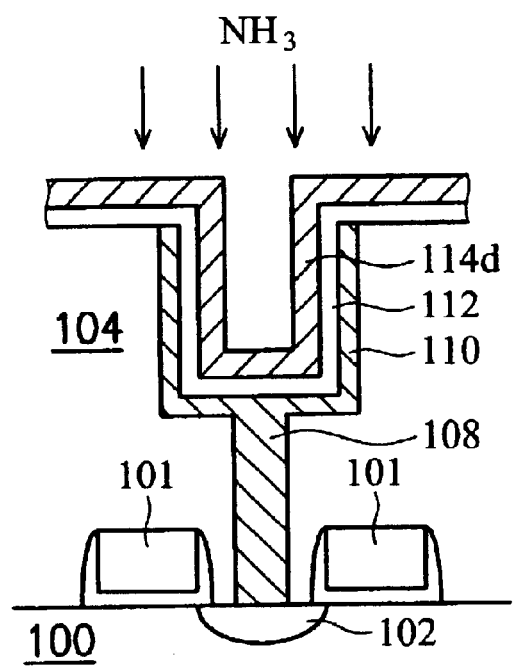

Next, the substrate is subjected to annealing in a second annealing step S106 in $NH_3$ gas for nitridation. At this time, pressure is preferably exceeding 5 torr, and less than 10 torr. The high temperature process causes the titanium nitride layer to be even more densified. Stress within the titanium nitride layer is thus released, forming a titanium nitride layer 114d having excellent quality, as shown in FIG. 3G.

According to the method for forming a titanium nitride layer, chemical vapor deposition and annealing are repeated to form a titanium nitride layer having low resistance and low leakage. It is a superb material for the upper electrode plate on a $Ta_2O_5$ capacitance dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a titanium nitride layer, comprising:
    exposing a semiconductor substrate to a reactive gas containing $TiCl_4$ and $NH_3$ for a first deposition to form a layer of titanium nitride over the substrate, at reaction pressure less than 1 torr and temperature is less than 500° C.;
    placing the semiconductor substrate in $NH_3$ gas for a first annealing operation, at pressure from 1 to 3 torr;
    exposing the semiconductor substrate to a reactive gas comprising $TiCl_4$ and $NH_3$ for a second deposition, at pressure exceeding 5 torr and temperature exceeding 500° C.; and
    subjecting the semiconductor substrate to a second annealing operation in $NH_3$ gas, at pressure exceeding 5 torr.

2. The method as claimed in claim 1, wherein the flow ratio of $NH_3/TiCl_4$ in the first deposition is 3~10.

3. The method as claimed in claim 2, wherein the flowrate of the $NH_3$ is 40~60 sccm.

4. The method as claimed in claim 3, wherein the thickness of the titanium nitride is at least 30 angstroms, and the deposition rate is 30~80 angstroms/min.

5. The method as claimed in claim 1, wherein the flow ratio of $NH_3/TiCl_4$ in the second deposition exceeds 5.

6. The method as claimed in claim 5, wherein the flowrate of the $TiCl_4$ in the second deposition is at least 25 sccm.

7. The method as claimed in claim 6, wherein the temperature of the substrate in the second deposition is 500~600° C., the deposition rate is 100~500 angstroms/min and the thickness of the titanium nitride is at least 60 angstroms.

8. The method as claimed in claim 1, wherein the flowrate of $NH_3$ in the first and second deposition exceeds 1000 sccm.

9. The method as claimed in claim 1, wherein the pressure in the second deposition is 5~10 torr.

10. The method as claimed in claim 1, wherein the pressure in the second annealing operation is 5~10 torr.

11. A method for forming a capacitor for a dynamic random access memory, comprising:
    forming a lower electrode plate in a predetermined capacitor area;
    forming a dielectric layer on the lower electrode plate;
    performing a first deposition to form a first titanium nitride layer on the dielectric layer, wherein the first deposition is carried out by exposing the substrate in a first reactive gas;

performing a first annealing operation;

performing a second deposition to form a second titanium nitride layer on the first titanium nitride layer, wherein the second deposition is carried out by exposing at least the first titanium nitride layer to a second reactive gas comprising $TiCl_4$ and NH3, at pressure exceeding 5 torr, flow ratio of $NH_3/TiCl_4$ exceeding 5, and with a temperature of the substrate exceeding 500° C.; and performing a second annealing operation.

12. The method as claimed in claim 11, wherein the dielectric layer is $Ta_2O_5$.

13. The method as claimed in claim 11, wherein the first reactive gas comprises $TiCl_4$ and $NH_3$.

14. The method as claimed in claim 13, wherein the flowrate of $NH_3$ in the first deposition is 40~60 sccm.

15. The method as claimed in claim 13, wherein in the first deposition the pressure is less than 1 torr, the temperature is less than 500° C., the thickness of the first titanium nitride is at least 30 angstroms, and the deposition rate is 30~80 angstroms/min.

16. The method as claimed in claim 11, wherein the first annealing operation is carried out in $NH_3$ gas, the pressure is 1~3 torr and the flowrate of $NH_3$ exceeds 1000 sccm.

17. The method as claimed in claim 11, wherein the thickness of the titanium nitride exceeds 60 angstroms, and the deposition rate is 100~500 angstroms/min.

18. The method as claimed in claim 17, wherein the flowrate of $TiCl_4$ in the second deposition is at least 25 sccm.

19. The method as claimed in claim 11, wherein the second annealing operation is carried out in $NH_3$ gas, the pressure in the second annealing step exceeds 5 torr, and the flowrate of $NH_3$ exceeds 1000 sccm.

20. The method as claimed in claim 11, wherein the lower electrode plate is conductive material.

21. The method as claimed in claim 20, wherein the conductive material is tungsten or polysilicon.

* * * * *